United States Patent
Wu et al.

(10) Patent No.: US 11,139,274 B2
(45) Date of Patent: Oct. 5, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Shang-Ruei Wu, Kaohsiung (TW); Chien-Yuan Tseng, Kaohsiung (TW); Meng-Jen Wang, Kaohsiung (TW); Chen-Tsung Chang, Kaohsiung (TW); Chih-Fang Wang, Kaohsiung (TW); Cheng-Han Li, Kaohsiung (TW); Chien-Hao Chen, Kaohsiung (TW); An-Chi Tsao, Kaohsiung (TW); Per-Ju Chao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/779,249

(22) Filed: Jan. 31, 2020

(65) Prior Publication Data

US 2020/0251449 A1 Aug. 6, 2020

Related U.S. Application Data

(60) Provisional application No. 62/799,701, filed on Jan. 31, 2019.

(51) Int. Cl.
| | |
|---|---|
| *H01L 25/065* | (2006.01) |
| *H01L 21/02* | (2006.01) |
| *H01L 21/768* | (2006.01) |
| *H01L 23/31* | (2006.01) |

(52) U.S. Cl.
CPC .... *H01L 25/0657* (2013.01); *H01L 21/02631* (2013.01); *H01L 21/76838* (2013.01); *H01L 23/3121* (2013.01)

(58) Field of Classification Search
CPC ....... H01L 2224/32225; H01L 2924/14; H01L 2924/00014; H01L 25/0657; H01L 23/49827; H01L 21/76838; H01L 25/0655; H01L 2924/3025; H01L 2924/00; H01L 2224/73204; H01L 23/552; H01L 25/03; H01L 23/3121; H01L 23/3128; H01L 2224/16225; H05K 3/284
See application file for complete search history.

(56) References Cited

U.S. PATENT DOCUMENTS

| | | | |
|---|---|---|---|
| 8,704,350 B2 * | 4/2014 | Park ................... | H01L 23/3128 257/686 |
| 2007/0252255 A1 * | 11/2007 | Lam ...................... | H01L 25/16 257/678 |
| 2018/0068989 A1 | 3/2018 | Chew | |

* cited by examiner

*Primary Examiner* — Jasmine J Clark
(74) *Attorney, Agent, or Firm* — Foley & Lardner LLP

(57) ABSTRACT

A semiconductor device package includes a substrate, a connection structure, a first package body and a first electronic component. The substrate has a first surface and a second surface opposite to the first surface. The connection structure is disposed on the first surface of the substrate. The first package body is disposed on the first surface of the substrate. The first package body covers the connection structure and exposes a portion of the connection structure. The first electronic component is disposed on the first package body and in contact with the portion of the connection structure exposed from the first package body.

30 Claims, 17 Drawing Sheets

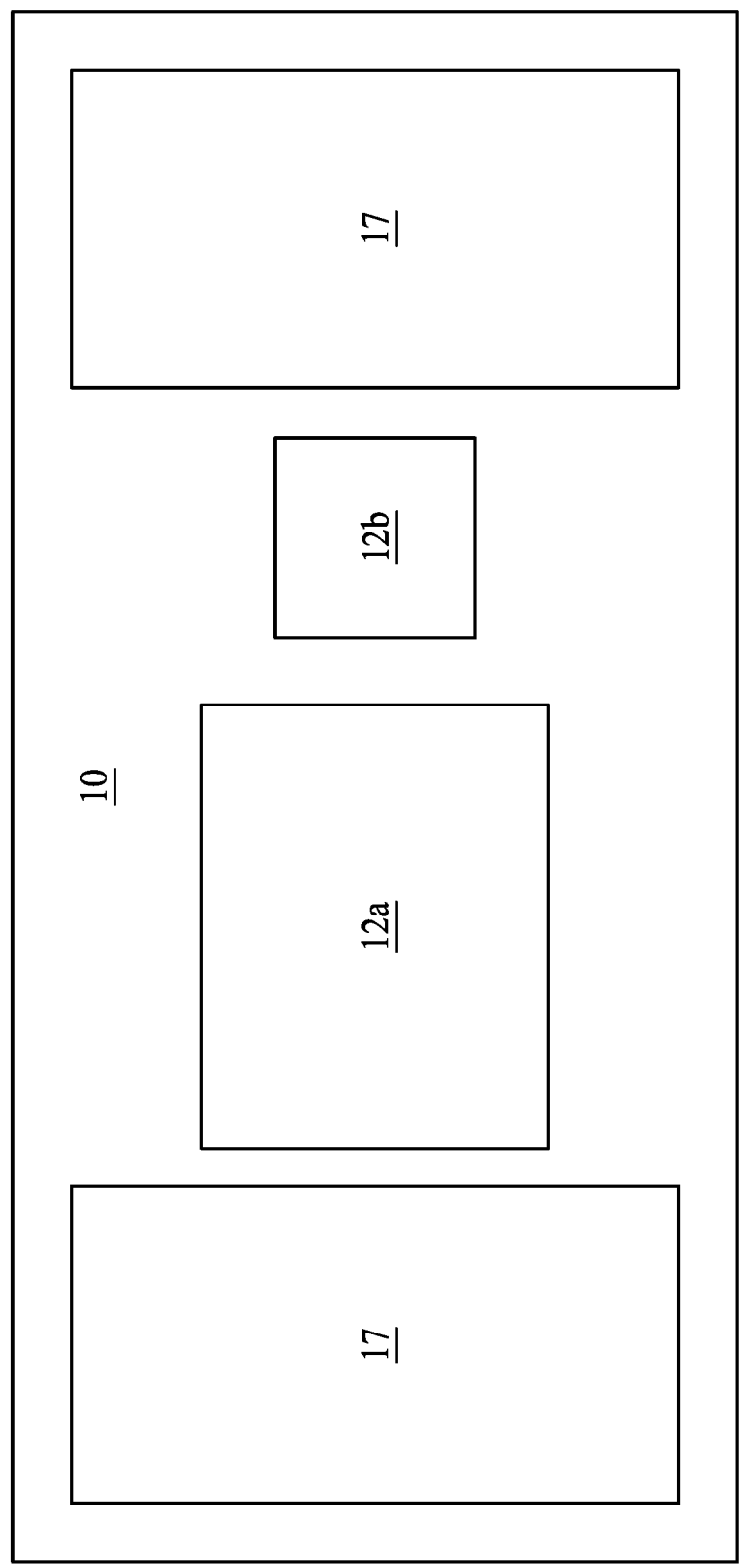

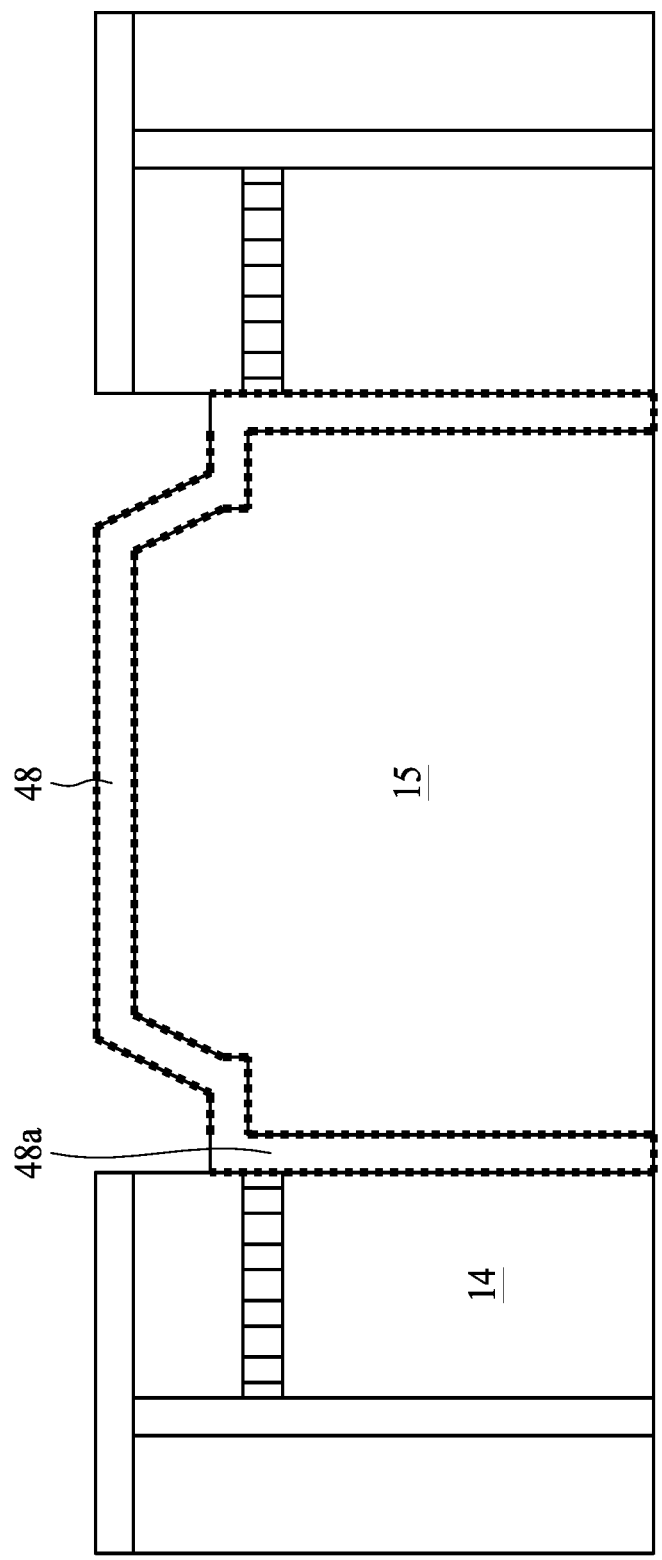

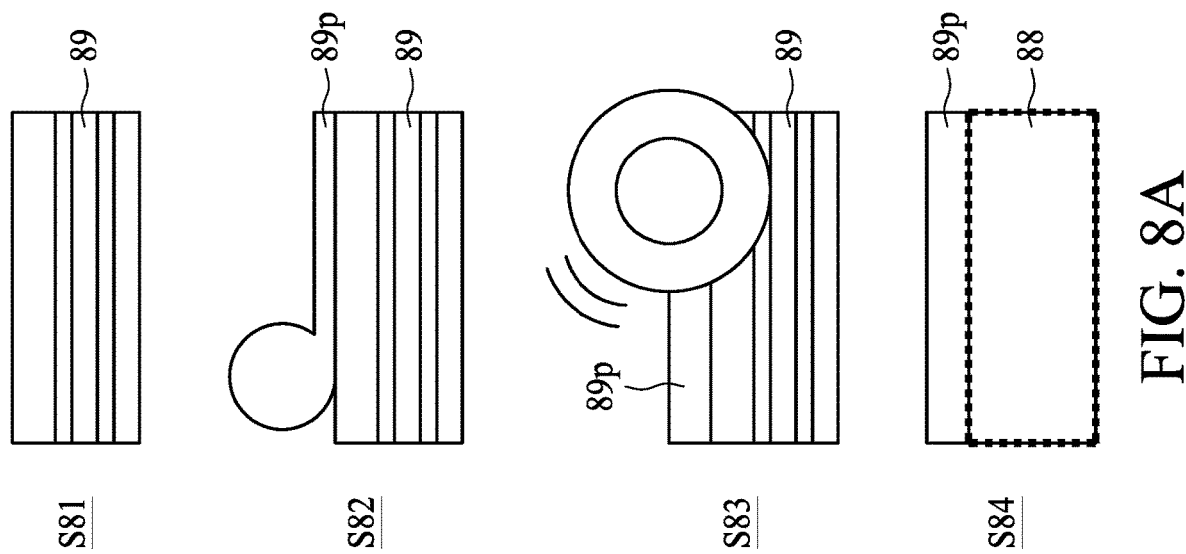

SEMICONDUCTOR DEVICE PACKAGE AND METHOD OF MANUFACTURING THE SAME

CROSS-REFERENCE TO RELATED APPLICATION

This application claims priority to and benefit of U.S. Provisional Application No. 62/799,701 filed Jan. 31, 2019, the contents of which are incorporated herein by reference in their entirety.

BACKGROUND

1. Technical Field

The present disclosure relates to a semiconductor device package and a method of manufacturing the same, and more particularly to a semiconductor device package including an antenna and a method of manufacturing the same.

2. Description of the Related Art

A semiconductor package device may include multiple electronic components disposed on a substrate to increase its performance and functionality. The electronic components can be arranged side-by-side on a top surface or a bottom surface of a substrate. However, this will increase the area of semiconductor device package. Alternatively, the electronic components may be arranged in a stacking arrangement. However, this will increase the thickness of the semiconductor device package, which will in turn hinder the semiconductor device package from being connected to another substrate (e.g., circuit board).

SUMMARY

In accordance with some embodiments of the present disclosure, a semiconductor device package includes a substrate, a connection structure, a first package body and a first electronic component. The substrate has a first surface and a second surface opposite to the first surface. The connection structure is disposed on the first surface of the substrate. The first package body is disposed on the first surface of the substrate. The first package body covers the connection structure and exposes a portion of the connection structure. The first electronic component is disposed on the first package body and in contact with the portion of the connection structure exposed from the first package body.

In accordance with some embodiments of the present disclosure, a semiconductor device package includes a substrate, a first electronic component, a connection structure and a first package body. The substrate has a first surface and a second surface opposite to the first surface. The first electronic component is disposed on the first surface of the substrate. The connection structure is disposed on the first surface of the substrate and surrounding the first electronic component. The first package body is disposed on the first surface of the substrate. The first package body covers the first electronic component and the connection structure and exposes an upper portion of the connection structure.

In accordance with some embodiments of the present disclosure, a method of manufacturing a semiconductor device package includes (a) proving a substrate having a first surface and a second surface opposite to the first surface; (b) disposing a connection structure on the first surface of the substrate; (c) forming a first package body on the first surface of the substrate to cover the connection structure and to expose an upper portion of the connection structure; and (d) disposing a first electronic component on the first package body to be electrically connected to the upper portion of the connection structure.

BRIEF DESCRIPTION OF THE DRAWINGS

FIG. 1D illustrates a bottom view of a semiconductor device package in accordance with some embodiments of the present disclosure.

FIG. 4C illustrates an enlarged view of a portion of the semiconductor device package as shown in FIG. 4A in accordance with some embodiments of the present disclosure.

FIG. 8A illustrates a method for manufacturing a connection structure in accordance with some embodiments of the present disclosure.

Figure 1A:
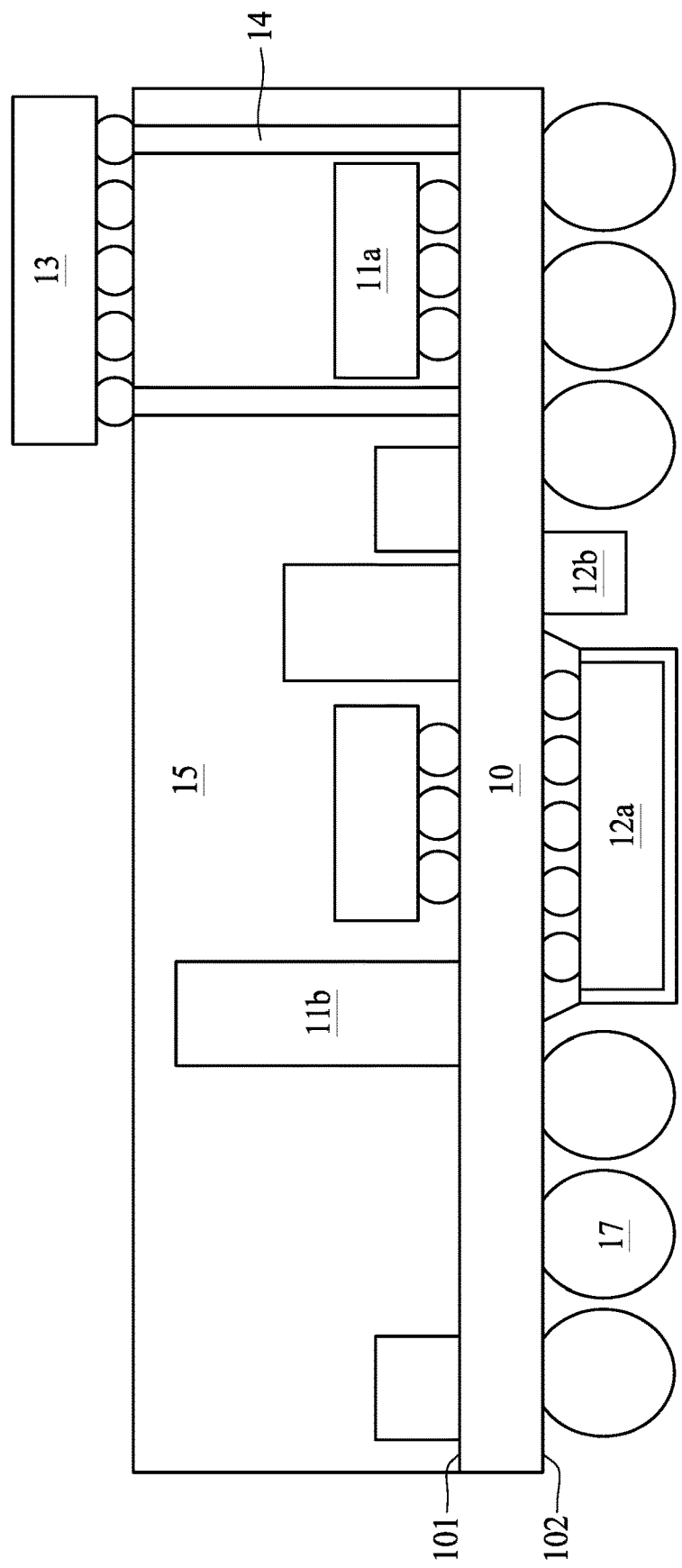
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1 in accordance with some embodiments of the present disclosure. The semiconductor device package 1 includes a substrate 10, electronic components 11a, 11b, 12a, 12b, 13, a connection structure 14, a package body 15 and electrical contacts 17.

The substrate 10 may be, for example, a printed circuit board (PCB), such as a paper-based copper foil laminate, a composite copper foil laminate, a polymer-impregnated glass-fiber-based copper foil laminate, or a combination of two or more thereof. The substrate 10 may include an interconnection structure, such as a redistribution layer (RDL). The substrate 10 has a surface 101 and a surface 102 opposite to the surface 101.

The electronic components 11a and 11b are disposed on the surface 101 of the substrate 10. The electronic component 11a may be an active component or another semiconductor device, such as an integrated circuit (IC) chip or a die. In some embodiments, the electronic component 11a could be any active component or another semiconductor package device. The electronic component 11b may be a passive component, such as a capacitor, a resistor or an inductor. The electronic components 11a and 11b may be electrically connected to one or more of another electronic component and/or the substrate 10 (e.g., to the interconnection layer), and electrical connection may be attained by way of flip-chip technique, wire-bond technique or SMT (Surface Mount Technology).

The connection structure 14 is disposed on the surface 101 of the substrate 10 to provide an electrical connection between the electronic component 13 and the substrate 10. In some embodiments the connection structure 14 may be or includes an interposer, a substrate or C2IM (Copper Connection in Material) or any other suitable connection device. The connection structure 14 may include at least one via extending from a top surface of the connection structure 14 to a bottom surface of the connection structure 14. In some embodiments, the connection structure 14 may surround one or more electronic components (e.g., the electronic component 11a).

The package body 15 is disposed on the surface 101 of the substrate 10 and covers or encapsulates the electronic components 11a, 11b and the connection structure 14. The top surface of the connection structure 14 is exposed from the package body 15 to provide electrical connections. In some embodiments, the package body 15 includes an epoxy resin having fillers, a molding compound (e.g., an epoxy molding compound or other molding compound), a polyimide, a phenolic compound or material, a material with a silicone dispersed therein, or a combination thereof.

The electronic component 13 is disposed on the top surface of the package body 15 and electrically connected to the connection structure 14 exposed from the package body 15 (e.g., connected to the top surface of the connection structure 14). The electronic component 13 can be disposed over any of the electronic components 11a and 11b. The electronic component 13 is electrically connected to the substrate 10 through the connection structure 14. The electronic component 13 may be an active component or a passive component.

The electronic components 12a and 12b are disposed on the surface 102 of the substrate 10. The electronic components 12a may be an active component, such as an IC chip or a die. In some embodiments, the electronic component 12a is a system-on-a-chip (SoC), which may include one or more processors, controllers or any other suitable electronic devices. The electronic component 12b may be a passive component, such as a capacitor, a resistor or an inductor. The electronic components 12a and 12b may be electrically connected to one or more of another electronic component and/or the substrate 10 (e.g., to the interconnection layer), and electrical connection may be attained by way of flip-chip technique, wire-bond technique or SMT.

The electrical contacts 17 are disposed on the surface 102 of the substrate 10 and may be electrically connected to the surface 101 of the substrate 10 through the interconnection structure within the substrate 10. In some embodiments, the electrical contacts 17 may be Controlled Collapse Chip Connection (C4) bumps, solder bumps, one or more Land Grid Arrays (LGA), or a combination of two or more thereof.

Figure 1B:
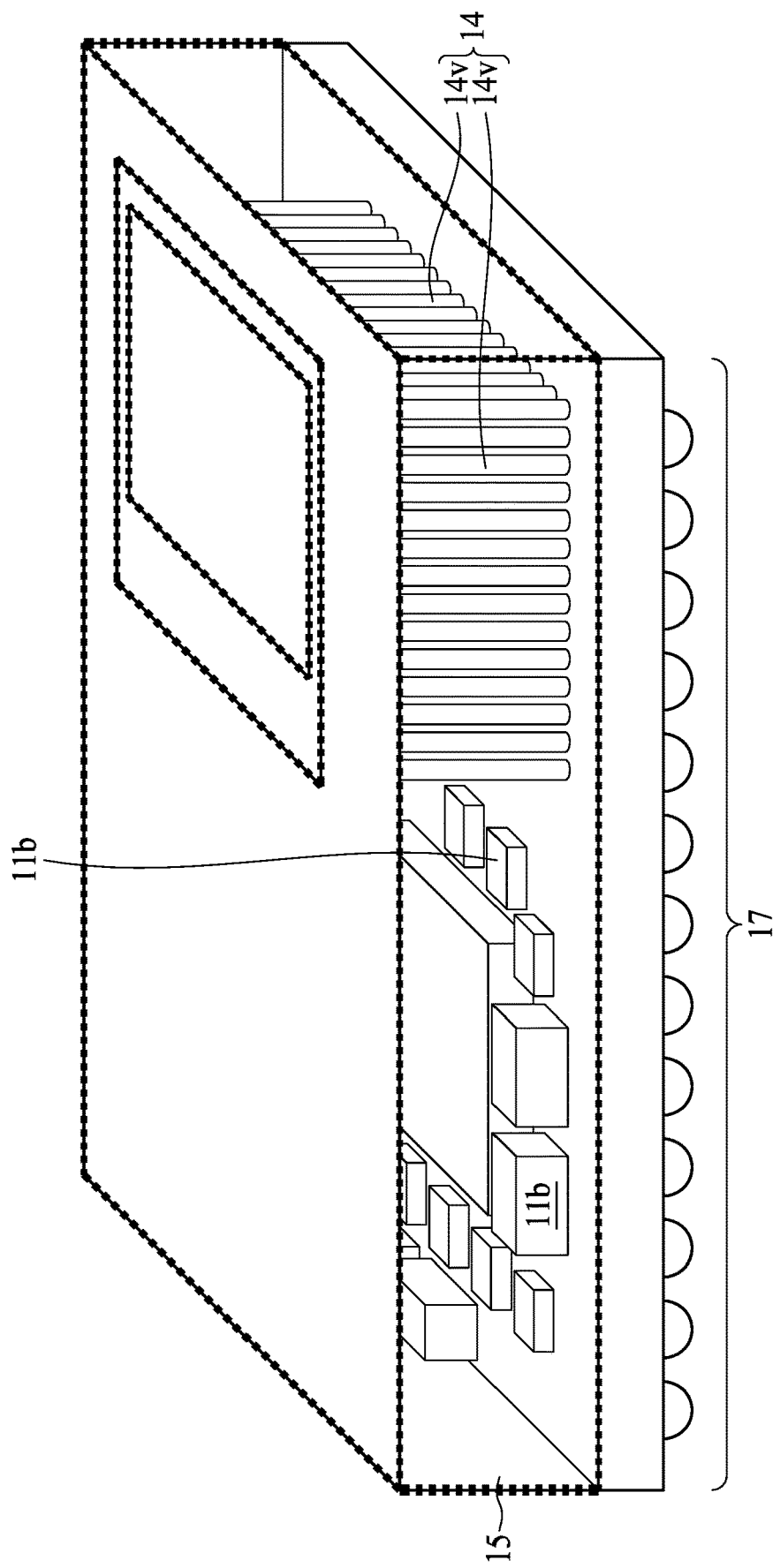
FIG. 1B illustrates a perspective view of a semiconductor device package in accordance with some embodiments of the present disclosure.

FIG. 1B illustrates a perspective view of the semiconductor device package 1 illustrated in FIG. 1A, in accordance with some embodiments of the present disclosure. For clarity, parts of the components (e.g., the electronic component 13) illustrated in FIG. 1A are omitted.

As shown in FIG. 1B, the connection structure 14 may surround any of the electronic components 11a and 11b. In some embodiments, the connection structure 14 may include a rectangular shape or any other suitable shapes depending on different design requirements. In some embodiments, the connection structure 14 includes a plurality of vertical connections 14v (e.g., vias) extending between the top surface and the bottom surface of the connection structure 14 to provide electrical connections.

Figure 1C:
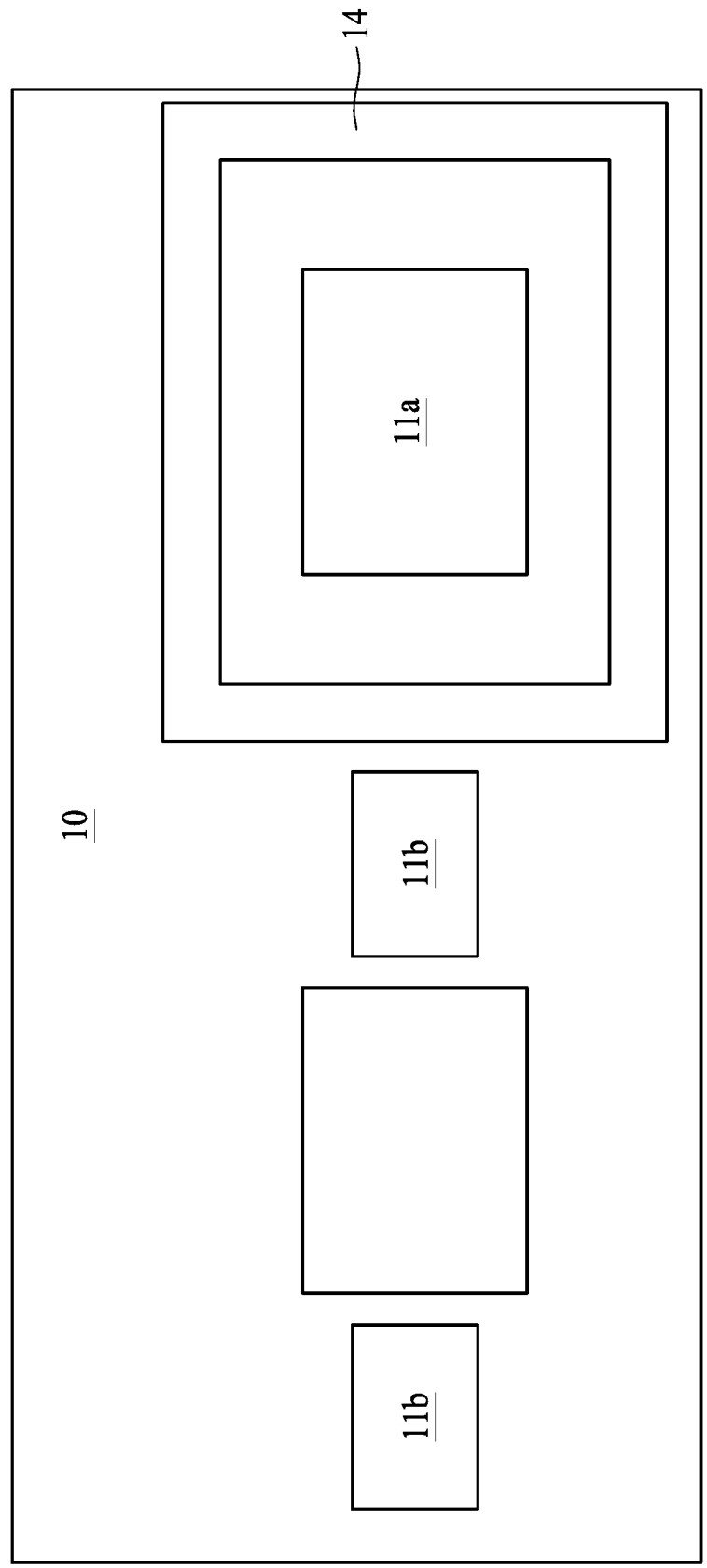
FIG. 1C illustrates a top view of a semiconductor device package in accordance with some embodiments of the present disclosure.

FIG. 1C illustrates a top view of the semiconductor device package 1 illustrated in FIG. 1A, in accordance with some embodiments of the present disclosure. For clarity, parts of the components (e.g., the electronic component 13 and the package body 15) illustrated in FIG. 1A are omitted.

As shown in FIG. 1C, the connection structure 14 is disposed on the surface 101 of the substrate 10. In some embodiments, the connection structure 14 may surround any of the electronic components 11a and 11b. In some embodiments, the connection structure 14 may include a rectangular shape or any other suitable shapes depending on different design requirements.

FIG. 1D illustrates a bottom view of the semiconductor device package 1 illustrated in FIG. 1A, in accordance with some embodiments of the present disclosure. As shown in FIG. 1D, the electrical contacts 17 may be disposed along to the edges of the substrate 10 to define ball arrays.

Figure 2:
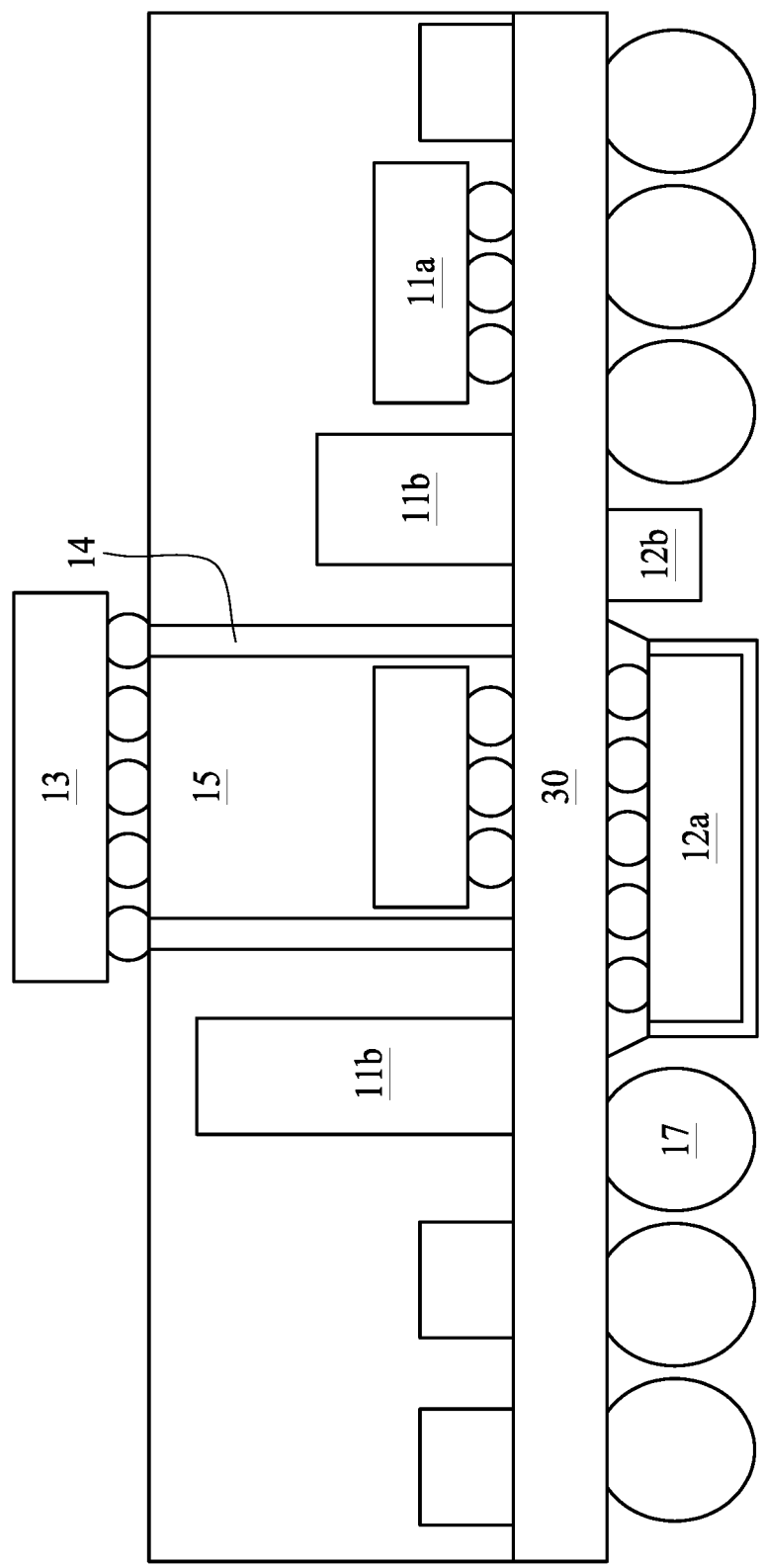
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package in FIG. 2 is similar to the semiconductor device package 1 in FIG. 1A except that in FIG. 1A, the electronic component 13 has a horizontal displacement relative to the electronic component 12a while in FIG. 2, the electronic component 13 is disposed over the electronic component 12a. For example, the electronic component 13 and the electronic component 12a are at least partially overlapped in a vertical direction. Since the electronic component 13 is disposed over the electronic component 12a, the signal or data transmission path between the electronic component 13 and the electronic component 12a can be reduced, which will improve the electrical performance of the semiconductor device package 2 in FIG. 2.

Figure 3:
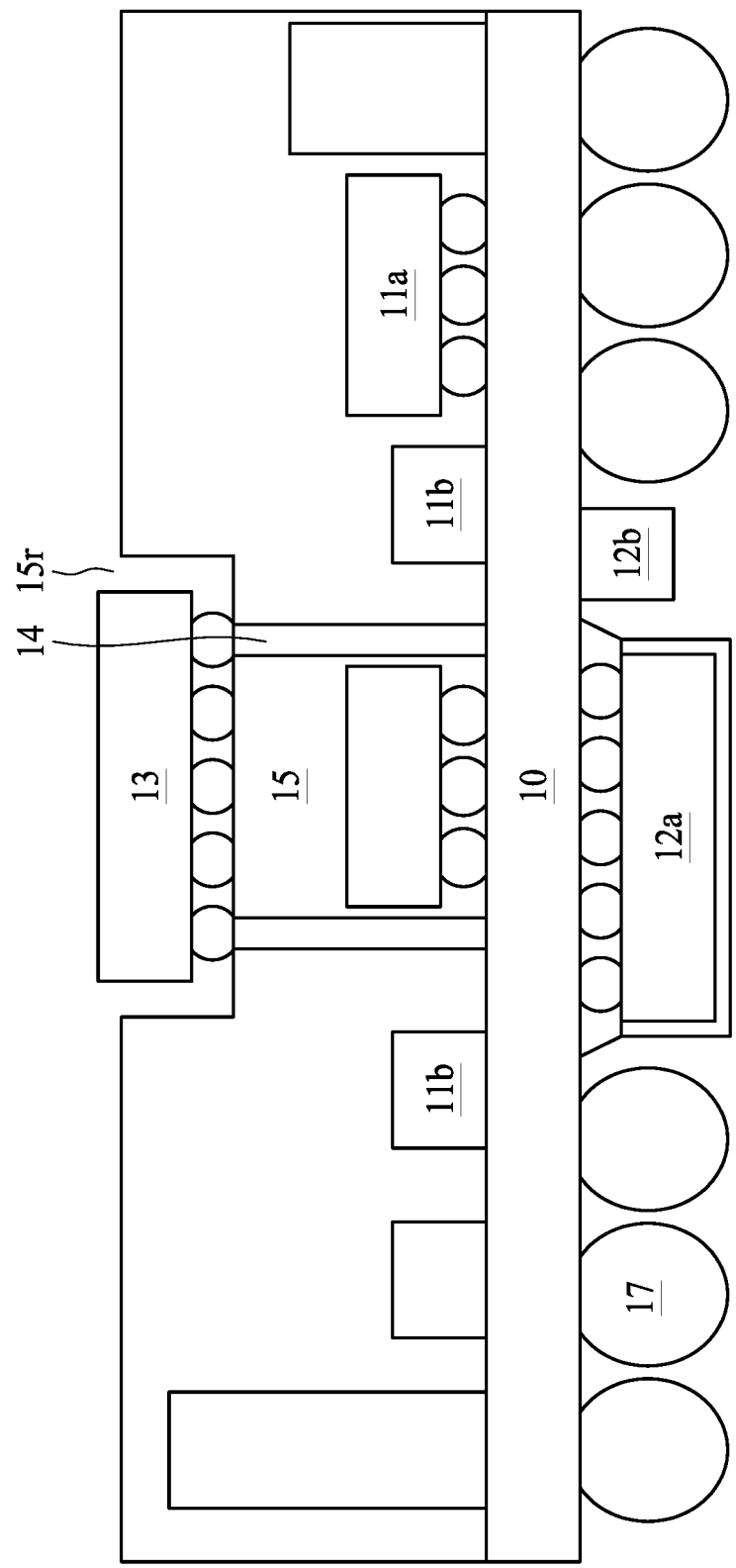
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package in FIG. 3 is similar to the semiconductor device package 1 in FIG. 1A, except that in FIG. 3, and the differences therebetween are described below.

The package body 15 includes a recess 15r extending from the top surface of the package body 15 toward the substrate 10. The recess 15r exposes the top surface of the connection structure 14. The electronic component 13 is disposed within the recess 15r defined by the package body 15 and electrically connected to the connection structure 14, which will further reduce the thickness of the semiconductor device package 3.

Figure 4A:
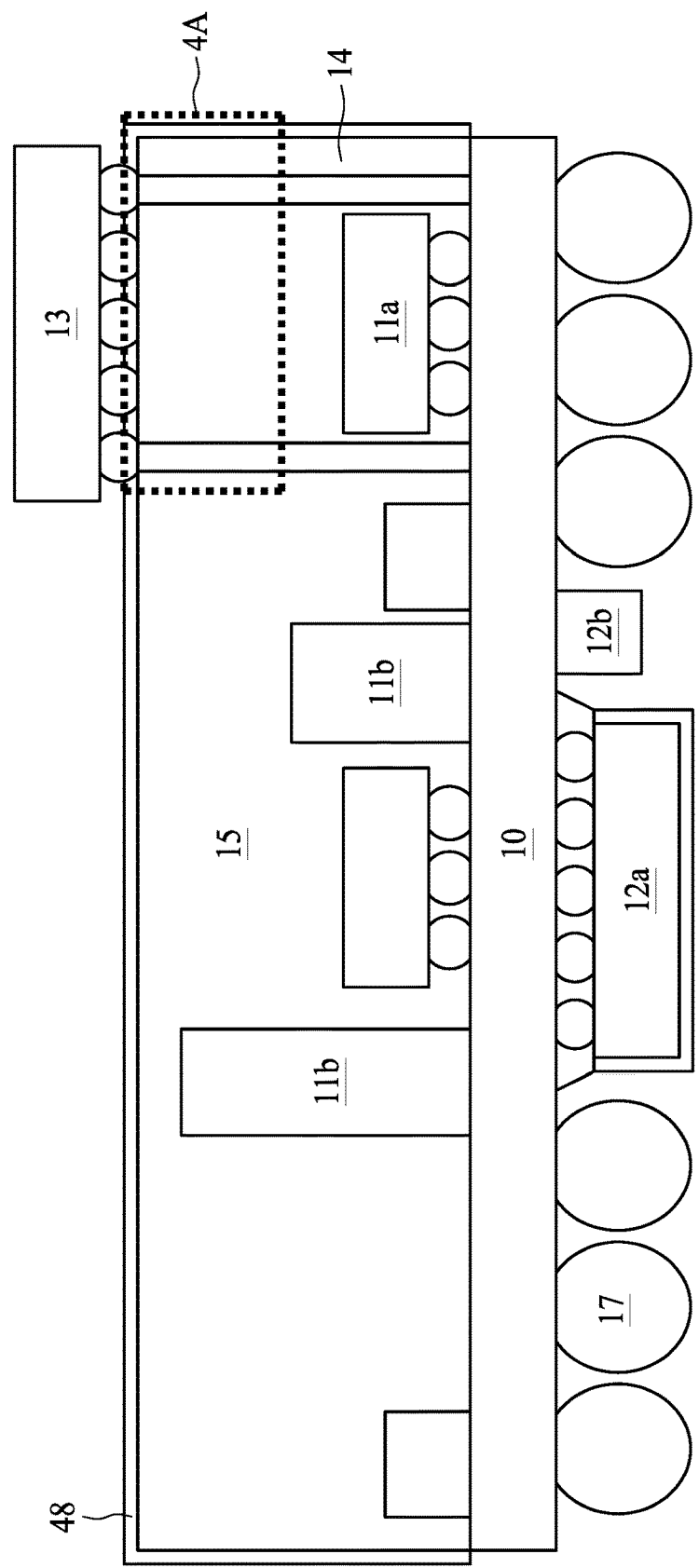
FIG. 4A illustrates a cross-sectional view of a semiconductor device package in accordance with some embodiments of the present disclosure.

FIG. 4A illustrates a cross-sectional view of a semiconductor device package 4 in accordance with some embodiments of the present disclosure. The semiconductor device package 4 in FIG. 4A is similar to the semiconductor device package 1 in FIG. 1A except that the semiconductor device package 4 further includes a shielding layer 48.

The shielding layer 48 is disposed on an outer surface of the package body 15 to provide electromagnetic interference (EMI) shielding for the electronic components 11a and 11b disposed on the surface 101 of the substrate 10. In some embodiments, the shielding layer 48 is a conductive thin film, and may include, for example, aluminum (Al), copper (Cu), chromium (Cr), tin (Sn), gold (Au), silver (Ag), nickel (Ni) or stainless steel, another metal, or a mixture, an alloy, or other combination of two of more thereof. In some embodiments, the semiconductor device package 2 or 3 illustrated in FIG. 2 or 3 may also include the shielding layer 48 disposed on the outer surface of the package body 15. A portion (e.g., the top surface) of the connection structure 14 is exposed from the shielding layer 48.

Figure 4B:
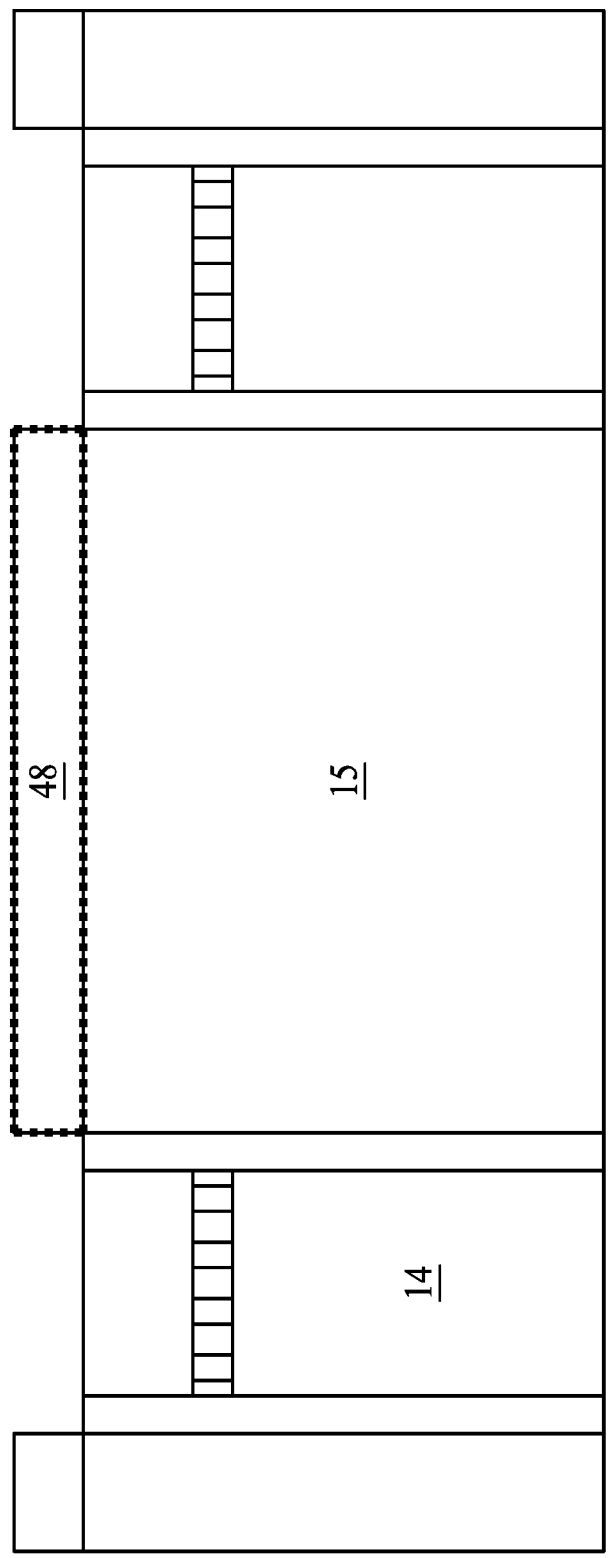
FIG. 4B illustrates an enlarged view of a portion of the semiconductor device package as shown in FIG. 4A in accordance with some embodiments of the present disclosure.

FIG. 4B illustrates an enlarged view of a portion of the semiconductor device package 4 encircled by a dotted-line rectangle as shown in FIG. 4A, in accordance with some embodiments of the present disclosure.

As shown in FIG. 4B, the connection structure 14 surrounds a portion of the package body 15 covering or encapsulating the electronic component 11a below the electronic component 13. In some embodiments, the shielding layer 48 may be disposed on the top surface of the package body 15 to provide EMI shielding. However, as shown in FIG. 4B, since the shielding layer 48 is not grounded, the shielding capability of the shielding layer 48 may be insufficient.

FIG. 4C illustrates an enlarged view of a portion of the semiconductor device package 4 encircled by a dotted-line rectangle as shown in FIG. 4A, in accordance with some embodiments of the present disclosure. The structure illustrated in FIG. 4C is similar to that in FIG. 4B, except that in FIG. 4C, the shielding layer 48 is electrically connected to ground through a conductive layer 48a between the connection structure 14 and the package body 15. For example, the conductive layer 48a extends along the sidewall of the connection structure 14 toward the substrate 10 and electrically connects to the substrate 10 (e.g., to the ground of the substrate 10). In accordance with the embodiments in FIG. 4C, since the shielding layer 48 is grounded, the shielding layer 48 can provide the better EMI shielding capability.

Figure 5:
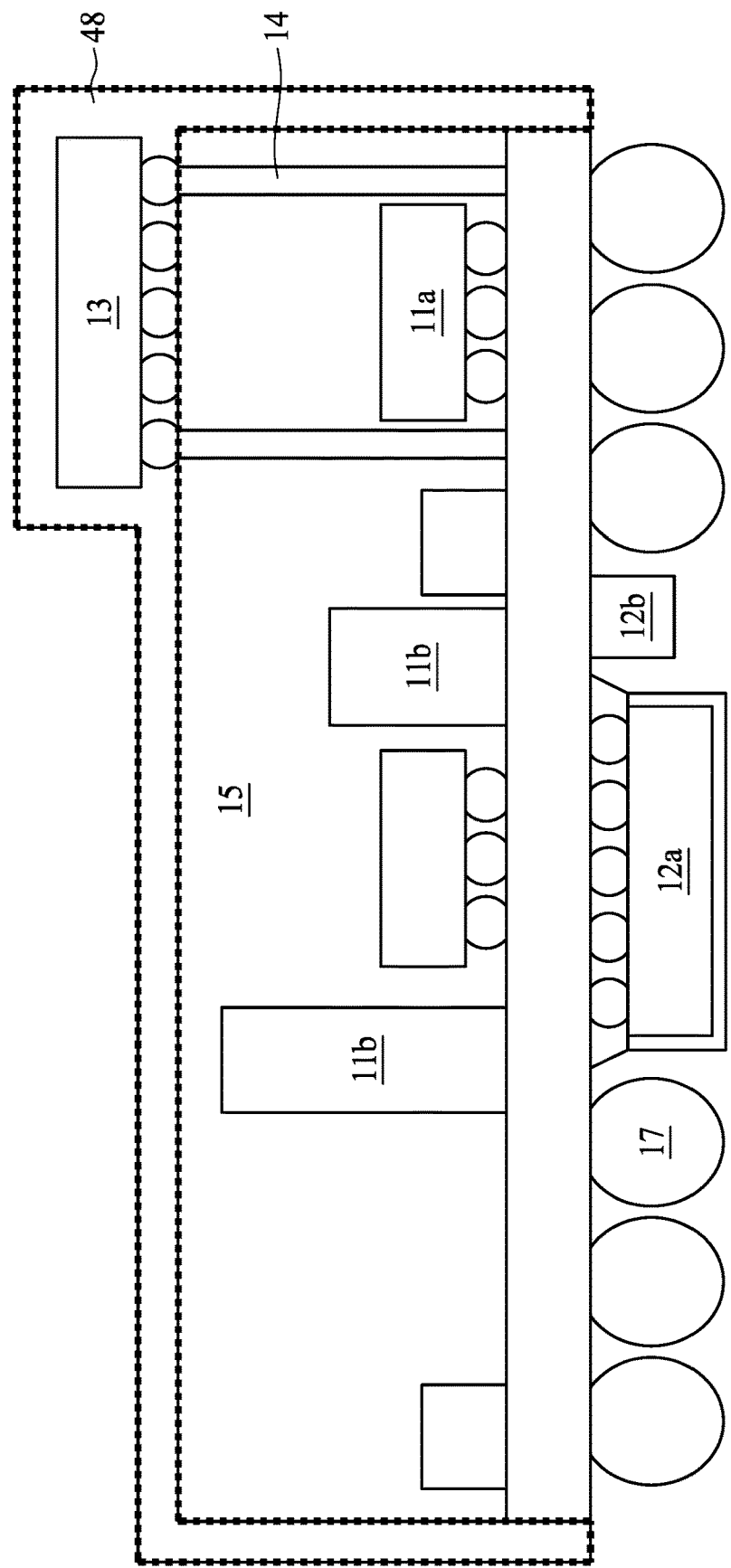
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 in FIG. 5 is similar to the semiconductor device package 4 in FIG. 4, and the differences therebetween are described below.

The shielding layer 48 further cover the electronic component 13 to provide the better EMI shielding capability for the electronic components 11a, 11b. Since the connection structure 14 of the semiconductor device package 5 in FIG. 5 is not required to be exposed from the shielding layer 48, the better EMI shielding capability can be obtained compared with the semiconductor device package 4 as shown in FIG. 4. In some embodiments, an insulation layer (e.g., an underfill or glue) is disposed between the electronic component 13 and the connection structure 14 to prevent the electrical contacts of the electronic component 13 from being short when forming the shielding layer 48. In some embodiments, the shielding layer 48 may further cover a lateral surface of the substrate 10.

Figure 6B:
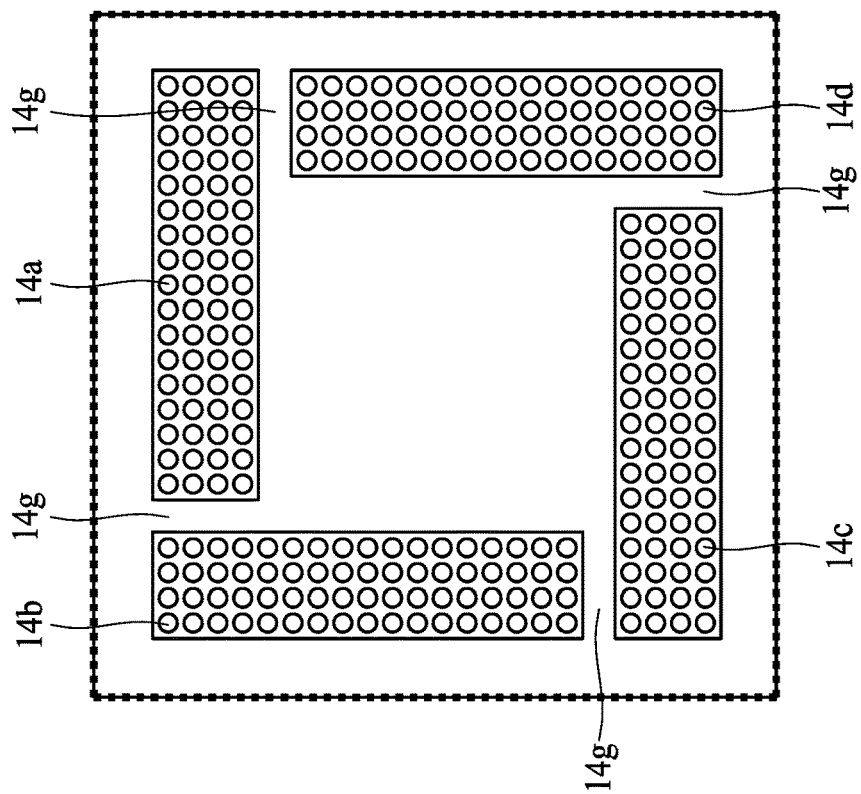
FIG. 6B illustrate a top view of a connection structure in accordance with some embodiments of the present disclosure.
Figure 6A:
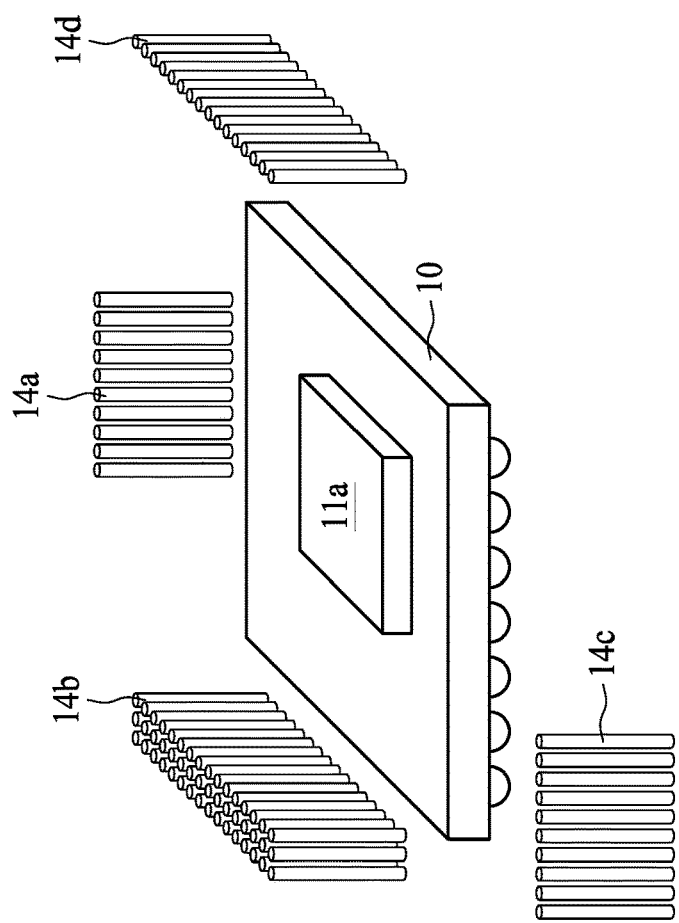
FIG. 6A illustrates an exploded view of a connection structure in accordance with some embodiments of the present disclosure.

FIG. 6A illustrates an exploded view of the connection structure 14 as shown in FIG. 1A, 2, 3, 4 or 5, and FIG. 6B illustrate a top view of the connection structure 14 in accordance with some embodiments of the present disclosure.

As shown in FIGS. 6A and 6B, the connection structure 14 may include portions 14a, 14b, 14c and 14d disposed on the top surface of the substrate 10 to surround the electronic component 11a. The portions 14a, 14b, 14c and 14d are arranged to define a rectangular shape with gaps 14g. For example, any two adjacent portions are separated from each other by the gap 14g. The gaps 14g of the connection structure 14 can be used to provide electrical connections between the area surrounded by the connection structure 14 and ground. In other words, the gaps 14g of the connection structure 14 can provide a grounding path for the area surrounded by the connection structure 14.

Figure 7B:
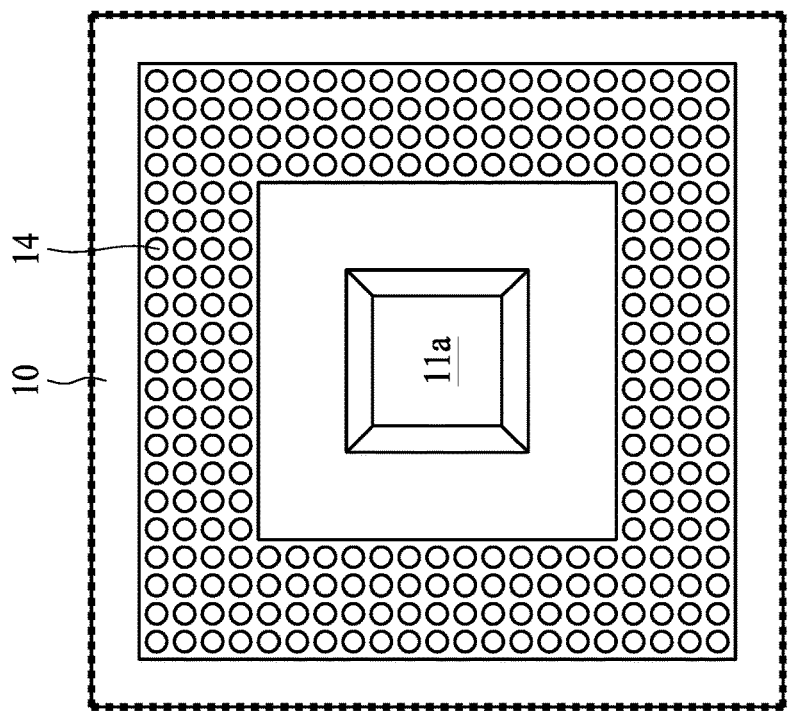
FIG. 7B illustrate a top view of a connection structure in accordance with some embodiments of the present disclosure.
Figure 7A:
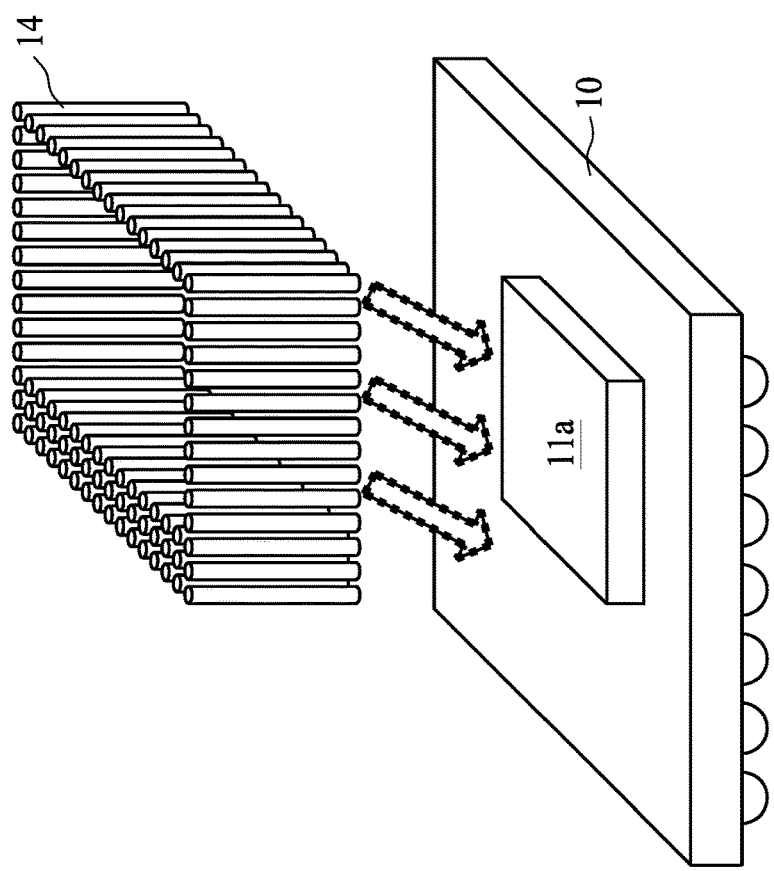
FIG. 7A illustrates an exploded view of a connection structure in accordance with some embodiments of the present disclosure.

FIG. 7A illustrates an exploded view of the connection structure 14 as shown in FIG. 1A, 2, 3, 4 or 5, and FIG. 7B illustrate a top view of the connection structure 14 in accordance with some embodiments of the present disclosure. The connection structure 14 in FIGS. 7A and 7B is similar to that in FIGS. 6A and 6B except that the connection structure 14 in FIGS. 7A and 7B is an integrally-formed structure (e.g., one piece). For example, as shown in FIGS. 7A and 7B, the connection structure 14 is rectangular and fully surrounds the electronic component 11a. In other embodiments, the connection structure 14 may be in any other shapes (e.g., circle, triangle or the like).

FIG. 8A illustrates a method for manufacturing a connection structure in accordance with some embodiments of the present disclosure. In some embodiments, the method illustrated in FIG. 8A can be used to manufacture the connection structure 14 as shown in FIG. 1A, 2, 3, 4 or 5.

Referring to the operation S81, a frame board 89 (e.g., an interposer or a substrate) is provided. The frame board 89 may be placed on a carrier to facilitate the subsequent processes. For example, the frame board 89 includes a bottom surface attached to the carrier. In some embodiments, a baking process can be carried out to the frame board 89.

Referring to the operation S82, a protection layer 89p is disposed on a top surface opposite to the bottom surface of the frame board 89. For example, a tape or an adhesive layer can be attached to the top surface of the frame board 89.

Referring to the operation S83, a singulation may be performed to separate out individual frame boards. The singulation may be performed, for example, by using a dicing saw, laser or other appropriate cutting technique.

Referring to the operation S84, a conductive layer 88 is formed on sidewall of each of the individual frame boards 89 to form the portion 14a, 14b, 14c or 14d of the connection structure 14 as shown in FIG. 6A and FIG. 6B. In some embodiments, the conductive layer 88 can be formed by, for example, sputtering or other suitable techniques. In some embodiments, a baking process may be carried out prior to the sputtering process.

Figure 8C:
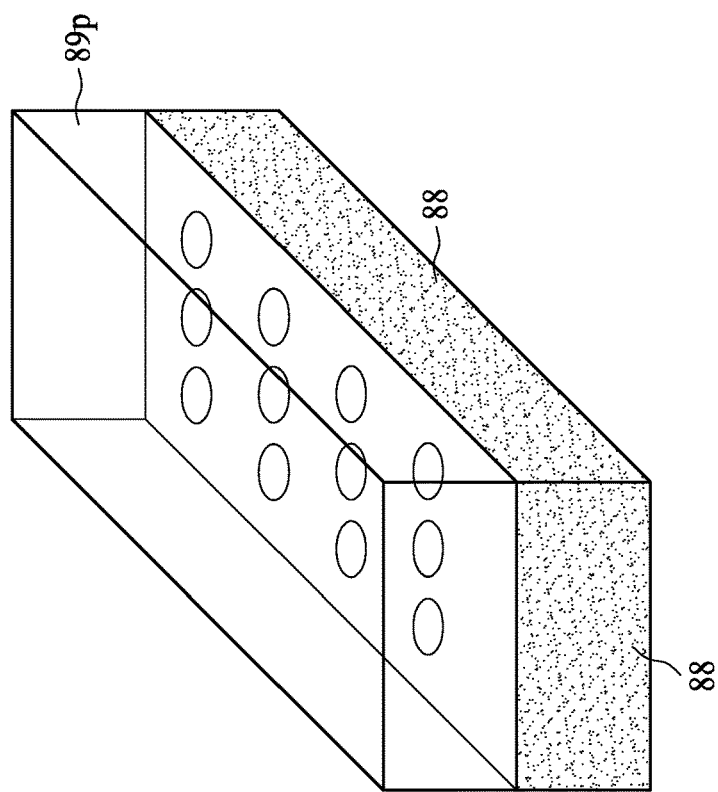
FIG. 8C illustrates a perspective view of a frame board in accordance with some embodiments of the present disclosure.
Figure 8B:
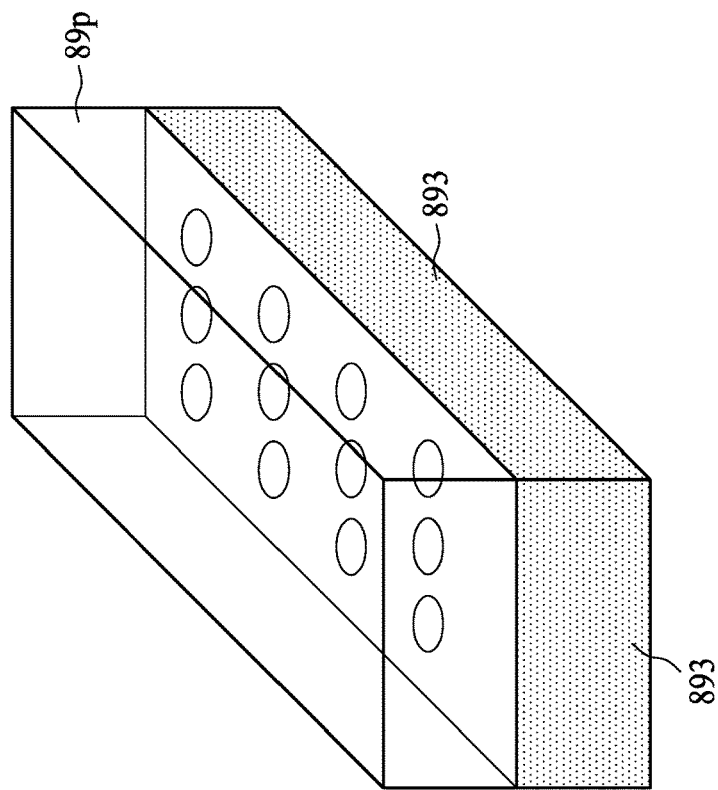
FIG. 8B illustrates a perspective view of a frame board in accordance with some embodiments of the present disclosure.

FIG. 8B illustrates a perspective view of an individual frame board before forming the conductive layer 88 on the sidewall 893 of the individual frame board (e.g., before the sputtering process), and FIG. 8C illustrates a perspective view of the individual frame board after forming the conducive layer 88 on the sidewall 893 of the individual frame board, in accordance with some embodiments of the present disclosure.

Figure 9B:
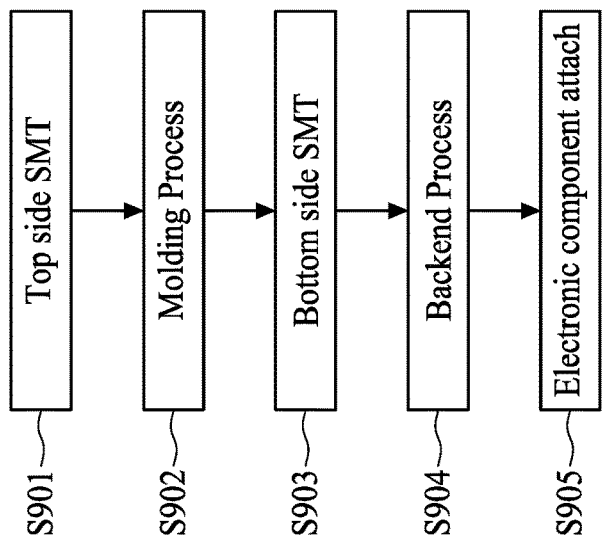
FIG. 9B is a flow chart showing a method of manufacturing a semiconductor device package in accordance with some embodiments of the present disclosure.
Figure 9A:
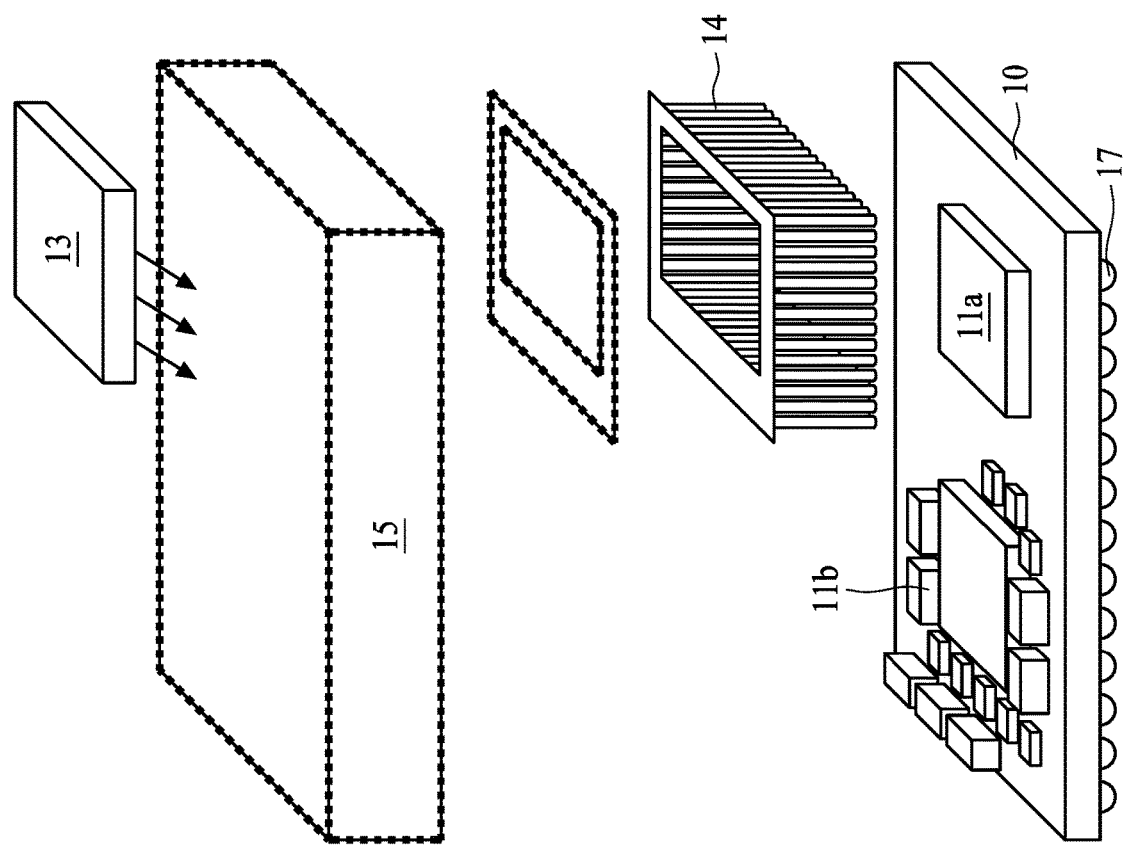
FIG. 9A illustrates an exploded view of a semiconductor device package in accordance with some embodiments of the present disclosure.

FIG. 9A illustrates an exploded view of the semiconductor device package 1 illustrated in FIG. 1A, and FIG. 9B is a flow chart showing a method of manufacturing the semiconductor device package 1, in accordance with some embodiments of the present disclosure.

Referring the operation S901, a process for top side surface mount technology (SMT) is performed. In some embodiments, the operation S901 may include the following steps: (i) providing the substrate 10 and performing the baking process for the substrate 10; (ii) performing solder paste printing on the top surface of the substrate 10; (iii) attaching the frame boards (i.e., the connection structure 14) as shown in FIG. 8C on the top surface of the substrate 10; (iv) attaching the electronic components 11a and 11b on the top surface of the substrate 10; and (v) performing a reflow process. The above steps carried out in the operation S901 can be adjusted or cancelled depending on different design requirements.

Referring to the operation S902, a molding process is carried out on the top surface of the substrate 10. In some embodiments, the operation S902 may include the following steps: (i) performing a baking process and plasma clean process; (ii) forming the packing body 15 on the top surface of the substrate 10 by, for example, molding process; (iii) performing a curing process for the package body 15; and (iv) performing a laser marking process. The above steps carried out in the operation S902 can be adjusted or cancelled depending on different design requirements.

Referring to the operation S903, a process for bottom side SMT is performed. In some embodiments, the operation S903 may include the following steps: (i) performing a treatment process; (ii) performing solder paste printing on the bottom surface of the substrate 10; (iii) forming electrical contacts 17 (e.g., solder balls) on the bottom surface of the substrate 10 by ball mount technology; (iv) attaching the electronic components 12a, 12b on the bottom surface of the substrate 10; (v) performing a reflow process. The above steps carried out in the operation S903 can be adjusted or cancelled depending on different design requirements.

Referring to the operation S904, a backend process is carried out. In some embodiments, the operation S904 may include the following steps: (i) performing a singulation process; (ii) performing a baking process (iii) forming a conductive layer (e.g., shielding layer) on an outer surface of the package body 15 by, for example, sputtering; (iv) performing a baking process and plasma clean process; (v) forming an underfill between the electronic component 12a and the bottom surface of the substrate 10; and (vi) performing a curing process for the underfill. The above steps carried out in the operation S904 can be adjusted or cancelled depending on different design requirements.

Referring the operation S905, the electronic component 13 is disposed on the package body 15 and electrically connected to the connection structure 14. In some embodiments, the operation S905 may include the following steps: (i) removing the tape of the top surface of the connection structure 14 to expose the conductive vias; (ii) attaching the electronic component 13 to the conductive vias; (iii) performing a baking process and plasma clean process; (iv) forming an underfill between the electronic component 13 and the connection structure 14; and (v) performing a curing process for the underfill. The above steps carried out in the operation S905 can be adjusted or cancelled depending on different design requirements.

In some embodiments, the function test can be carried out after the operation S902 (i.e., molding process) and prior to the operation S903 (i.e., bottom side SMT). Because the electronic component 12a (e.g., SoC) is relatively expensive, performing the function test before the bottom side SMT can reduce the manufacturing cost if any defects can be found before mounting the electronic component 12a on the bottom surface of the substrate 10. In other embodiments, the function test can be carried out after the operation S905.

Figure 10B:
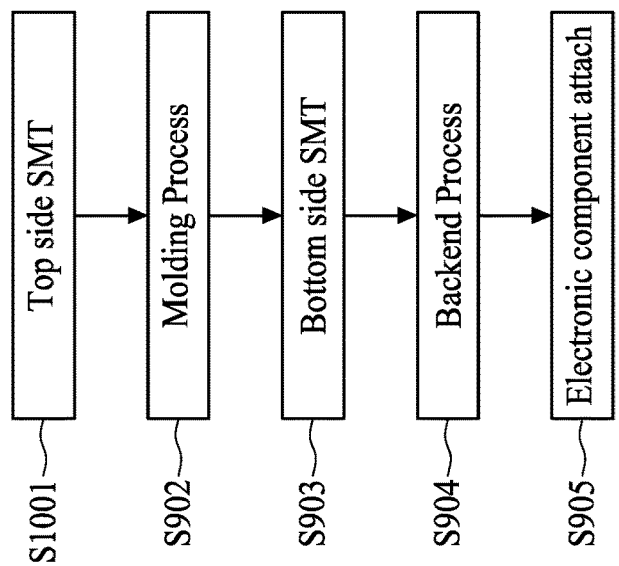
FIG. 10B is a flow chart showing a method of manufacturing a semiconductor device package in accordance with some embodiments of the present disclosure.
Figure 10A:
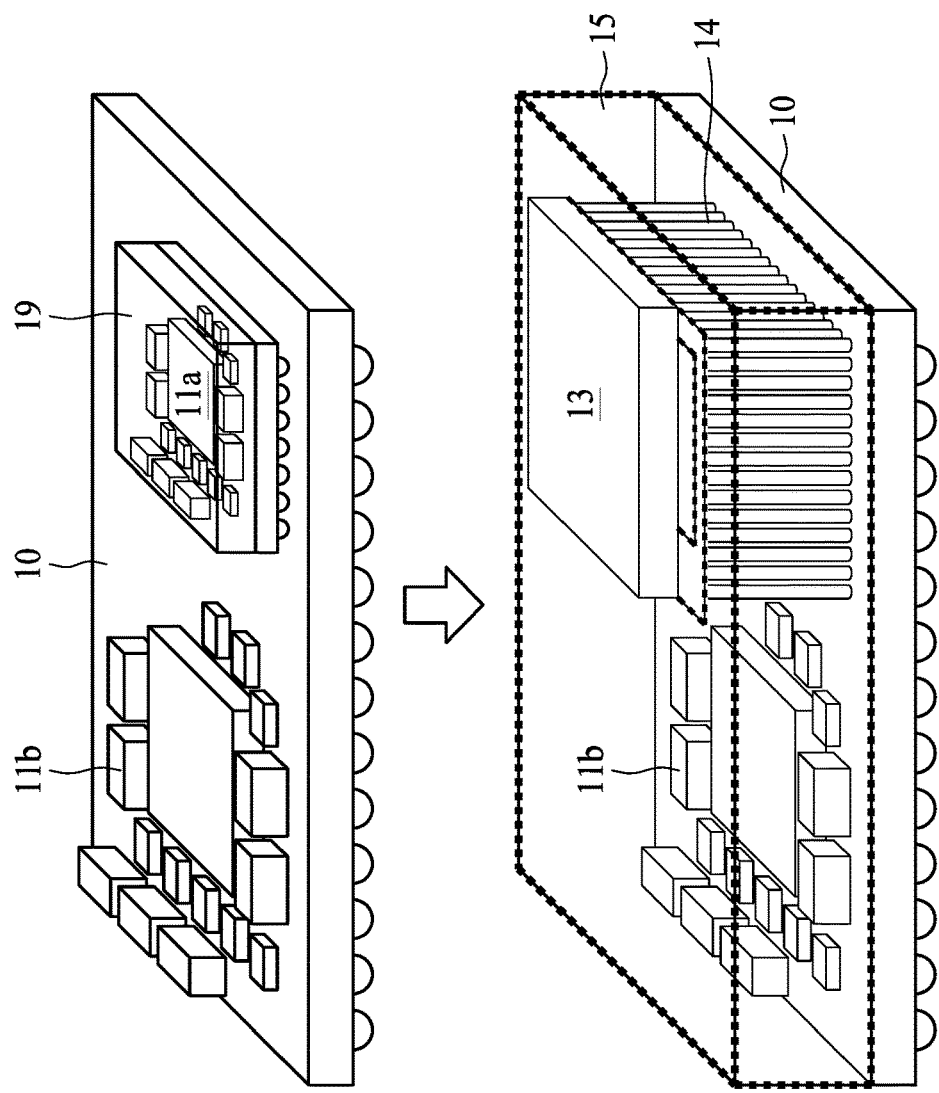
FIG. 10A illustrates an exploded view of a semiconductor device package in accordance with some embodiments of the present disclosure.

FIG. 10A illustrates an exploded view of a semiconductor device package, and FIG. 10B is a flow chart showing a method of manufacturing the semiconductor device package, in accordance with some embodiments of the present disclosure. The semiconductor device package in FIG. 10A is similar to the semiconductor device package in FIG. 9A except that the semiconductor device package in FIG. 10A further comprises a package body 19 covering or encapsulating the electronic component 11a. The method illustrated in FIG. 10B is similar to the method in FIG. 9B, and the differences therebetween are described below.

Referring to the operation S1001, a process for top side SMT is performed. In some embodiments, the operation S1001 may include the following steps: (i) providing the substrate 10 and performing the baking process for the substrate 10; (ii) performing solder paste printing on the top surface of the substrate 10; (iii) attaching the frame boards (i.e., the connection structure 14) as shown in FIG. 8C on the top surface of the substrate 10; (iv) attaching the electronic components 11a and 11b on the top surface of the substrate 10 and forming the package body 19 to cover the electronic component 11a surrounded by the connection structure 14 by, for example, molding techniques; and (v) performing a reflow process. The above steps carried out in the operation S1001 can be adjusted or cancelled depending on different design requirements.

In some embodiments, the function test can be carried out after the operation S902 (i.e., molding process) and prior to the operation S903 (i.e., bottom side SMT). Because the electronic component 12a (e.g., SoC) is relatively expensive, performing the function test before the bottom side SMT can reduce the manufacturing cost if any defects can be found before mounting the electronic component 12a on the bottom surface of the substrate 10. In other embodiments, the function test can be carried out after the operation S905.

Figure 11:
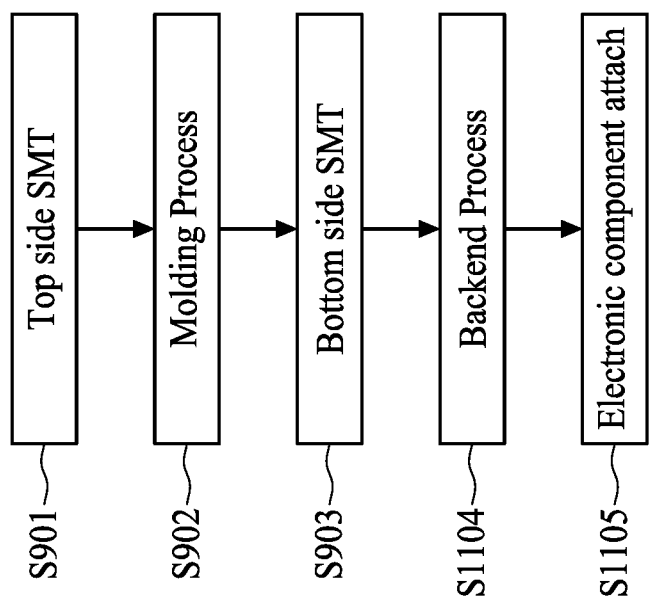
FIG. 11 illustrates a method of manufacturing a semiconductor device package in accordance with some embodiments of the present disclosure.

FIG. 11 illustrates a method of manufacturing the semiconductor device package 5 illustrated in FIG. 5 in accordance with some embodiments of the present disclosure. The operations illustrated in FIG. 11 are similar to those illustrated in FIG. 9B, and the difference therebetween will be described below.

Referring to the operation 1104, a backend process is carried out. In some embodiments, the operation S1104 may include the following steps: (i) performing a baking process and plasma clean process; (ii) forming an underfill between the electronic component 12a and the bottom surface of the substrate 10; (iii) performing a curing process for the underfill; and (iv) performing a singulation process. The above steps carried out in the operation S1104 can be adjusted or cancelled depending on different design requirements.

Referring the operation S1105, the electronic component 13 is disposed on the package body 15 to be electrically connected to the connection structure 14. In some embodiments, the operation S1105 may include the following steps: (i) removing the tape of the top surface of the connection structure 14 to expose the conductive vias; (ii) attaching the electronic component 13 to the conductive vias; (iii) performing a baking process and plasma clean process; (iv) forming an underfill between the electronic component 13 and the connection structure 14; (v) performing a curing process for the underfill; (vi) performing a baking process; and (vii) forming a conductive layer 48 (e.g., shielding layer) on an outer surface of the package body 15 and the electronic component 13 by, for example, sputtering. The above steps carried out in the operation S1105 can be adjusted or cancelled depending on different design requirements.

In some embodiments, the function test can be carried out after the operation S902 (i.e., molding process) and prior to the operation S903 (i.e., bottom side SMT). Because the electronic component 12a (e.g., SoC) is relatively expensive, performing the function test before the bottom side SMT can reduce the manufacturing cost if any defects can be found before mounting the electronic component 12a on the bottom surface of the substrate 30. In other embodiments, the function test can be carried out after the operation S1105.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate having a first surface and a second surface opposite to the first surface;
   a connection structure disposed on the first surface of the substrate;

a first package body disposed on the first surface of the substrate, the first package body partially covering the connection structure, wherein a portion of the connection structure is exposed from the first package body;
a first electronic component disposed on the first package body and in contact with the portion of the connection structure exposed from the first package body; and
a third electronic component disposed on the second surface of the substrate.

2. The semiconductor device package of claim 1, further comprising a second electronic component disposed on the first surface of the substrate and surrounded by the connection structure.

3. The semiconductor device package of claim 2, wherein the first electronic component is disposed over the second electronic component.

4. The semiconductor device package of claim 1, wherein the third electronic component includes a system-on-a-chip (SoC).

5. The semiconductor device package of claim 1, wherein the first electronic component has a horizontal displacement relative to the third electronic component.

6. The semiconductor device package of claim 1, wherein the third electronic component overlaps the first electronic component in a direction perpendicular to the first surface of the substrate.

7. The semiconductor device package of claim 1, wherein the first package body includes a recess, and the first electronic component is partially disposed within the recess.

8. The semiconductor device package of claim 7, further comprising a second electronic component disposed on the first surface of the substrate, wherein a height of the second electronic component is greater than a height of the connection structure, wherein the recess is defined by a top surface and a lateral surface of the first package body, and wherein a top surface of the second electronic component is higher than the top surface of the first package body.

9. The semiconductor device package of claim 1, further comprising a shielding layer disposed on an outer surface of the first package body, wherein the shielding layer exposes the portion of the connection structure exposed from the first package body.

10. The semiconductor device package of claim 9, further comprising an underfill between the first electronic component and the first package body, wherein the shielding layer further covers the first electronic component and the underfill.

11. The semiconductor device package of claim 9, wherein the shielding layer extends along a sidewall of the connection structure and electrically connected to the substrate.

12. The semiconductor device package of claim 1, wherein the connection structure includes a first portion and a second portion spaced apart from the first portion.

13. The semiconductor device package of claim 1, further comprising a second electronic component disposed on the first package body and electrically connected to the upper portion of the connection structure.

14. The semiconductor device package of claim 13, wherein the second electronic component at least partially overlaps the first electronic component in a direction perpendicular to the first surface of the substrate.

15. The semiconductor device package of claim 13, further comprising a third electronic component disposed on the second surface of the substrate.

16. The semiconductor device package of claim 15, wherein the second electronic component has a horizontal displacement relative to the third electronic component.

17. The semiconductor device package of claim 15, wherein the third electronic component overlaps the second electronic component in a direction perpendicular to the first surface of the substrate.

18. The semiconductor device package of claim 13, wherein the first package body includes a recess, and the first electronic component is partially disposed within the recess.

19. The semiconductor device package of claim 18, wherein a height of the fourth electronic component is greater than a height of the connection structure, wherein the recess is defined by a top surface and a lateral surface of the first package body, and wherein a top surface of the fourth electronic component is higher than the top surface of the first package body.

20. The semiconductor device package of claim 13, further comprising a shielding layer disposed on an outer surface of the first package body, wherein the shielding layer exposes the upper portion of the connection structure.

21. The semiconductor device package of claim 20, further comprising an underfill between the second electronic component and the first package body, wherein the shielding layer further covers the second electronic component and the underfill.

22. A semiconductor device package, comprising:
a substrate having a first surface and a second surface opposite to the first surface;
a first electronic component disposed on the first surface of the substrate;
a connection structure disposed on the first surface of the substrate and surrounding the first electronic component;
a first package body disposed on the first surface of the substrate, the first package body covering the first electronic component and partially covering the connection structure, wherein an upper portion of the connection structure is exposed from the first package body; and
a fourth electronic component disposed on the first surface of the substrate, wherein the first electronic component and the fourth electronic component are separated by the connection structure.

23. The semiconductor device package of claim 22, wherein the connection structure includes a first portion and a second portion spaced apart from the first portion.

24. The semiconductor device package of claim 22, further comprising a fifth electronic component disposed on the first surface of the substrate, wherein the first electronic component and the fifth electronic component are separated by the connection structure, and wherein the fourth electronic component and the fifth electronic component are separated by the connection structure.

25. A method of manufacturing a semiconductor device package, the method comprising:
(a) providing a substrate having a first surface and a second surface opposite to the first surface;
(b) disposing a connection structure on the first surface of the substrate;
(c) forming a first package body on the first surface of the substrate to partially cover the connection structure, wherein an upper portion of the connection structure is exposed from the first package body;
(d) disposing a first electronic component on the first package body to be electrically connected to the upper portion of the connection structure; and (e) disposing a third electronic component on the second surface of the substrate.

26. The method of claim 25, further comprising, before operation (c), forming a second electronic component on the top surface of the substrate, wherein the second electronic component is surrounded by the connection structure.

27. The method of claim 25, wherein the first electronic component has a horizontal displacement relative to the third electronic component.

28. The method of claim 25, wherein the third electronic component overlaps the first electronic component in a direction perpendicular to the first surface of the substrate.

29. The method of claim 25, further comprising forming a conductive layer on an outer surface of the first package body by sputtering.

30. The method of claim 25, further comprising performing a function test after operation (c) and prior to operation (e).

* * * * *